United States Patent [19]

Roy

[11] Patent Number: 5,374,827
[45] Date of Patent: Dec. 20, 1994

[54] BIAS FOR A CONVERSION DYNODE IN AN ELECTRON MULTIPLIER

[75] Inventor: Raymond L. Roy, Monson, Mass.

[73] Assignee: Detector Technology, Inc., Sturbridge, Mass.

[21] Appl. No.: 151,755

[22] Filed: Nov. 15, 1993

[51] Int. Cl.$^5$ .............................. H01J 37/244
[52] U.S. Cl. ...................... 250/397; 250/283
[58] Field of Search .............. 250/397, 299, 300, 283, 250/281; 313/103 R, 103 CM, 105 R, 105 CM

[56] References Cited

U.S. PATENT DOCUMENTS

| | | | |
|---|---|---|---|
| 2,798,162 | 7/1957 | Hendee | 250/299 |
| 3,898,456 | 8/1975 | Dietz | 250/299 |
| 4,972,083 | 11/1990 | Taya et al. | 250/281 |

Primary Examiner—Jack I. Berman
Attorney, Agent, or Firm—Richard H. Kosakowski

[57] ABSTRACT

An electron multiplier is disclosed having separate detector and conversion dynode elements. A single power supply external to the electron multiplier is used to bias the detector element. A DC-to-DC voltage converter within the electron multiplier is responsive to the detector bias voltage for converting this voltage to a greater value that is used to bias the conversion dynode.

17 Claims, 3 Drawing Sheets

BIAS FOR A CONVERSION DYNODE IN AN ELECTRON MULTIPLIER

BACKGROUND OF THE INVENTION

This invention relates to electron multipliers, and more particularly, to an electron multiplier having a conversion dynode that is biased by the same power supply that biases the detector component of the electron multiplier, through use of a DC-to-DC voltage converter.

A continuous dynode electron multiplier ("CDEM") is used in various scientific instruments, such as mass spectrometers. The CDEM senses the presence of one or more atomic or subatomic particles at its input, such as an ion or an electron, and provides a plurality of electrons at its output. The output electrons provide an indication of a characteristic of the primary radiation input to the electron multiplier. The output electrons are generated by secondary emissions through repeated collisions of initially the input particle, and then secondary electrons, with the inner surface of the detector component of the CDEM.

More specifically, the input particle(s) enters the detector portion of the CDEM and is accelerated therethrough by an electrostatic field of usually several thousand volts applied across the length of the detector. The inner surface of the detector is typically comprised of glass that is heavily lead-doped. The outer supporting body of the detector is usually stainless steel or other suitable material. Each time the particle strikes the inner surface of the detector, one or more secondary electrons are generated which themselves travel down the detector. A plurality of secondary electrons will be released from the glass if the electrons striking the inner surface of the detector have accumulated enough energy from the applied electrostatic field. Depending upon the design of the CDEM, this process of secondary emission is repeated numerous times throughout the entire length of the detector. Total electron multiplication (i.e., gain) of the CDEM from input particle detection through output electron emission is typically $10^4$–$10^8$.

The use of a conversion dynode as a separate element in the electron multiplier is well known. The conversion dynode improves the high mass sensitivity of the overall detector when used in scientific instruments such as mass spectrometers. That is, the conversion dynode gives the electron multiplier increased detection capability of particles of relatively greater mass. In such a configuration, the electron multiplier comprises the detector and the conversion dynode, which is separately biased apart from the detector. The operating voltage (i.e., "bias") supplied to the detector is in the range of 800 v–3 kv, while the operating voltage of the conversion dynode is 4–20 kv.

Because of the difference in operating voltages, it is known in the art to provide two separate power supplies located external to the CDEM. Also, because of the separate supplies, two separate high voltage feedthroughs are also required. The feedthroughs accommodate the electrical connections from the power supplies through the package enclosure of the CDEM and into the internal portion of the CDEM held at vacuum pressure, the internal CDEM portion being where the detector and conversion dynode are located.

However, drawbacks exist in such a dual power supply configuration. An initial consideration is the added cost of the separate supply needed for the conversion dynode. A greater problem, however, may lie in the second feedthrough. Feedthroughs are relatively expensive to implement in an electron multiplier. They can also cause undesirable electrical noises to be generated if not properly designed and maintained. Further, sometimes existing mass spectrometers initially designed without a conversion dynode are desired to be upgraded to include a conversion dynode. To accommodate the conversion dynode, typically an additional power supply external to the electron multiplier package must be provided, if possible. Heretofore, no known retrofit of an existing mass spectrometer to include an electron multiplier having a conversion dynode has been possible without adding an additional power supply within the mass spectrometer yet external to the electron multiplier package, and without adding the corresponding additional feedthrough in the electron multiplier package.

Additionally, it has been discovered in those configurations where separate supplies are provided for the conversion dynode and detector that damage to the instrument (e.g., the mass spectrometer) may result in instances of sudden vacuum leaks. In these situations, the instrument turns off the detector power supply, while the supply for the conversion dynode is either not turned off or is turned off much too slowly, resulting in damage to the instrument.

Accordingly, it is a primary object of the present invention to bias both the detector and the conversion dynode elements of a CDEM using a single power supply external to the CDEM and a single corresponding feedthrough into the CDEM package.

It is a general object of the present invention to eliminate the separate power supply and feedthrough used for a conversion dynode required in a prior art electron multiplier having a conversion dynode.

It is a further object of the present invention to provide separate and different bias voltages for the detector and conversion dynode elements, respectively, of an electron multiplier by utilizing a single power supply and feedthrough along with a DC-to-DC voltage converter.

It is a still further object of the present invention to allow a scientific instrument such as a mass spectrometer to have its present electron multiplier without a conversion dynode replaced with an electron multiplier with a conversion dynode without having to modify by adding or changing any of the existing circuitry or components in the mass spectrometer external to the electron multiplier package; more specifically, without having to add an additional power supply to bias the conversion dynode, and without having to provide a corresponding separate feedthrough therefor in the electron multiplier package.

It is a still further object of the present invention to prevent damage to the scientific instrument incorporating the electron multiplier having both a detector and a conversion dynode by having the single supply that powers both the detector and the conversion dynode turn off in the case of vacuum leaks in the electron multiplier package.

It is yet another object of the present invention to incorporate a DC-to-DC voltage converter into the electron multiplier package without forcing a redesign of the package; the DC-to-DC voltage converter being connected to the existing detector power supply located external to the electron multiplier package; the DC-to-DC voltage converter not causing an overload of current drain on the external detector power supply.

The above and other objects and advantages of this invention will become more readily apparent when the following description is read in conjunction with the accompanying drawings.

SUMMARY OF THE INVENTION

To overcome the deficiencies of the prior art and to achieve the objects listed above, the Applicant has invented a biasing scheme for an electron multiplier having separate internal detector and conversion dynode components. In the preferred embodiment, a scientific instrument such as a mass spectrometer incorporates an electron multiplier. The mass spectrometer includes a power supply external to the electron multiplier that feeds a voltage on a line into the electron multiplier package through a feedthrough formed in the electron multiplier package. The entire electron multiplier package is typically held at vacuum pressure. Inside the package, the voltage is fed through some electronic filter circuitry and then to the detector without altering its magnitude. The voltage is also fed through additional electronic filter circuitry and to a DC-to-DC voltage converter located inside the electron multiplier package. The DC-to-DC voltage converter increases the voltage to a magnitude sufficient to bias the conversion dynode.

DETAILED DESCRIPTION OF THE PREFERRED EMBODIMENTS

Figure 1:
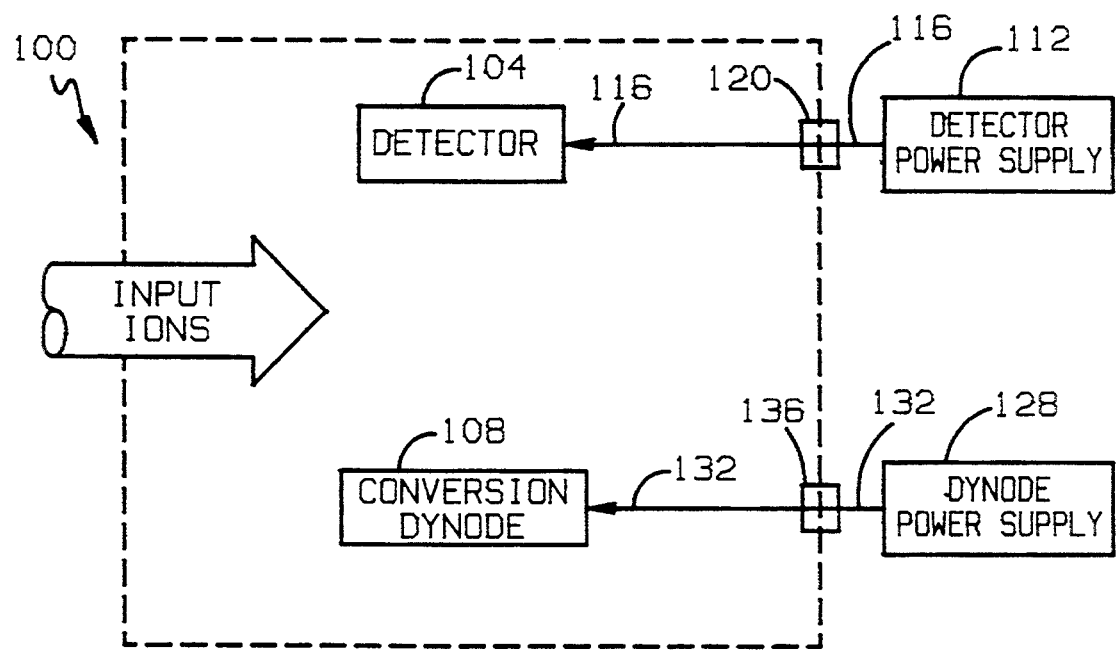
FIG. 1 is a block diagram of a prior art scheme of biasing the detector and conversion dynode components of an electron multiplier using separate power supplies.

Referring to the drawings in detail, a preferred embodiment of an electron multiplier having the biasing scheme of the present invention is generally indicated by the reference numeral 100. The electron multiplier 100 comprises separate detector 104 and conversion dynode 108 components. A power supply 112 located external to the electron multiplier 100 provides a voltage on a line 116 that passes through a feedthrough 120 in the electron multiplier 100 and is presented to the detector 104. This voltage is also applied to a DC-to-DC voltage converter 124, located within the electron multiplier 100. The DC-to-DC voltage converter 124 increases the amplitude of the voltage applied to it, and provides this increased voltage to the conversion dynode 108 within the electron multiplier 100.

Referring now to FIG. 1, there illustrated in simplified block diagram form is a prior art scheme for biasing an electron multiplier 100 having separate detector 104 and conversion dynode 108 components. Each component 104,108 is powered by its own dedicated supply 112,128 located external to the electron multiplier 100. The detector power supply 112 provides a voltage of typically 800 v–3 kv on a line 116 that passes through a feedthrough 120 in the electron multiplier 100. The voltage on the line 116 then continues on to the detector 104. In a like manner, a dynode power supply 128 provides a voltage of typically 4–20 kv on a line 132 that passes through a feedthrough 136 and into the electron multiplier 100. The voltage on the line 132 then continues on to the conversion dynode 108. The relative inefficiencies of such a dual and separate power supply system have been described in detail hereinbefore.

Figure 2:
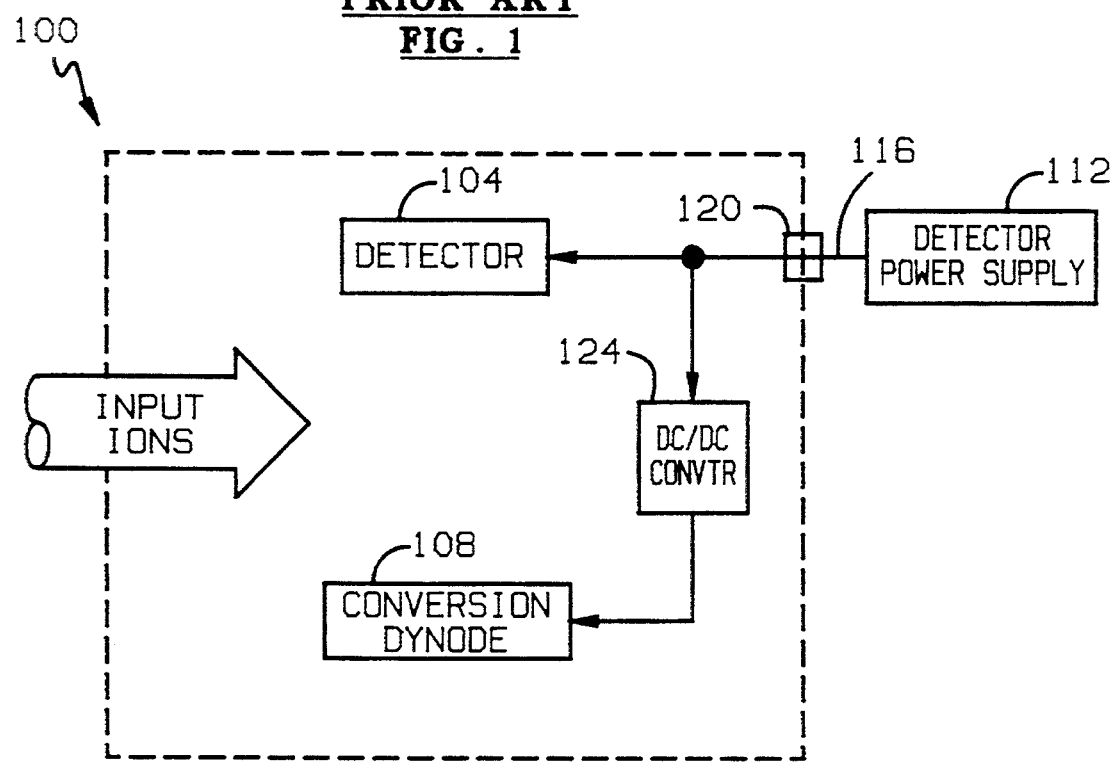
FIG. 2 is a block diagram of apparatus for biasing both the detector and conversion dynode components of an electron multiplier using a single power supply, together with a DC-to-DC voltage converter, in accordance with the present invention.

Referring now to FIG. 2, there illustrated is the biasing scheme of the present invention employing a single power supply 112 and corresponding feedthrough 120. The detector power supply 112 is the same as that in FIG. 1; i.e., it provides a voltage of typically 800 v–3 kv on a line 116 through a feedthrough 120 in the electron multiplier 100 package. The voltage on the line 116 continues on to the detector 104. As mentioned hereinbefore, the voltage applied to the detector 104 accelerates the motion of the input or other particles applied thereto, as well as accelerating the secondary emitted electrons throughout the length of the detector 104.

The voltage on the line 116 from the detector power supply 112 is also applied to a DC-to-DC converter 124. The DC-to-DC voltage converter 124 steps up or increases the value of the voltage applied thereto to typically 4–20 kv, in order to bias the conversion dynode 108. The dynode 108 is used to increase the speed of the charged particles (i.e., ions, electrons, etc.) as they enter the detector 104. It is a wellknown fact that the efficiency of an electron multiplier 100 is increased as the speed of the particles entering the detector 104 is correspondingly increased. Typically, the entire electron multiplier 100 is held at vacuum pressure inside. Thus, it can be readily seen by comparing FIG. 1 with FIG. 2 that the biasing scheme of the present invention eliminates the need for a second external power supply 128 to power the conversion dynode 108, at the expense of adding a relatively simple DC-to-DC voltage converter 124 within the electron multiplier 100.

Figure 3:
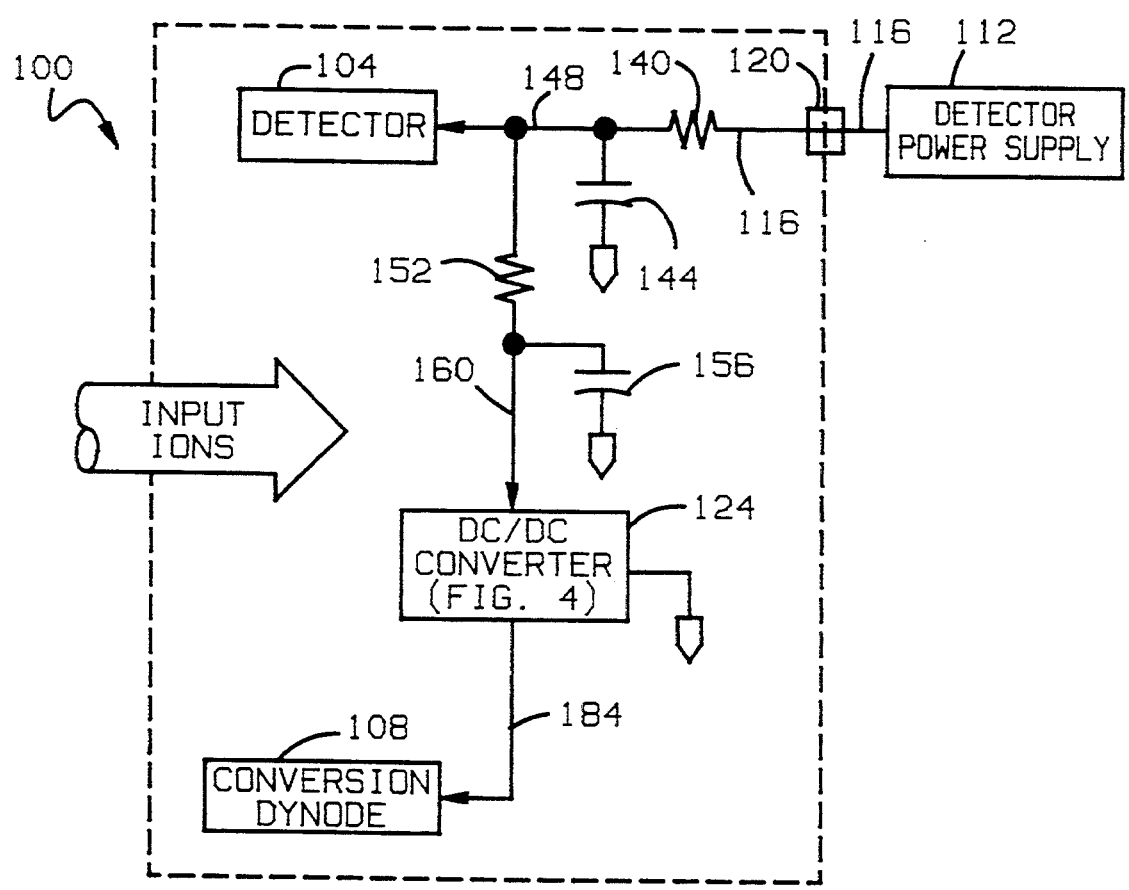
FIG. 3 is a block diagram and schematic illustration showing the biasing scheme of the present invention of FIG. 2 in greater detail.

Referring now to FIG. 3, there illustrated in greater detail is a combined block diagram and schematic drawing of the biasing scheme of the present invention of FIG. 2. The voltage on the line 116 from the detector power supply 112 passes through the feedthrough 120 into the electron multiplier 100. The voltage on the line 116 is applied to a first resistor 140. In an exemplary embodiment of the present invention, this resistor 140 has a value of 10 megohms. Disposed after the resistor 140 is a first capacitor 144 that, in combination with the first resistor 140, forms a filter that filters out any transients on the power supply line 116 input to the electron multiplier 100. The value of the first capacitor 144 may be 220 picofarads ("pf"). The output voltage from the filter on the signal line 148 is provided to the detector 104 for biasing thereof.

In accordance with the present invention, the voltage applied on the line 148 to the detector 104 is also applied to a second resistor 152, having a value of, e.g., 50 megohms. The other side of the second resistor 152 is applied to the input of the DC-to-DC converter 124. Also connected to the output of the second resistor 152 is a second capacitor 156 having a value of, e.g., 220 pf. In a similar manner to the first resistor 140 and first capacitor 144, the second resistor 152 and second capacitor 156 also form a filter for filtering out any transients that may occur on the voltage input to the DC-to-DC voltage converter 124 on the line 160. As mentioned hereinbefore, the voltage input to the DC-to-DC voltage converter 124 on the line 160 has a value of approximately 800 v–3 kv.

Figure 4:
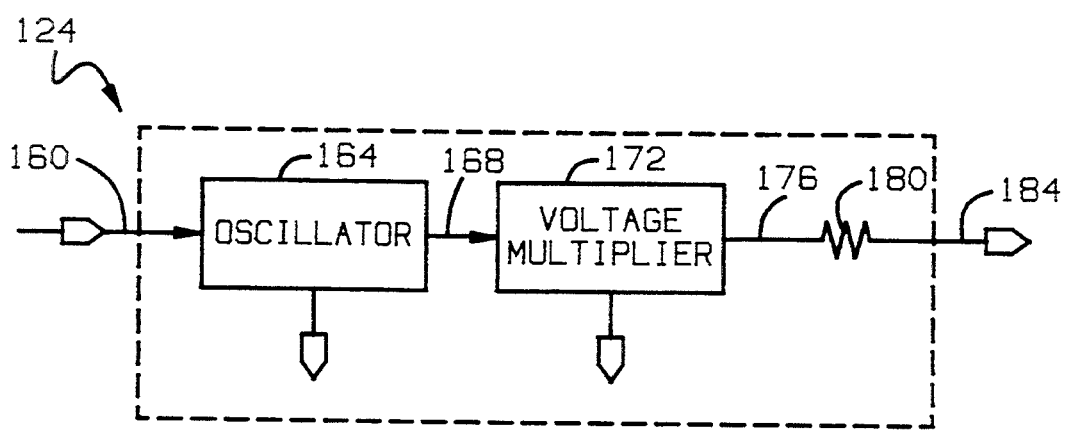
FIG. 4 is a block diagram and schematic illustration of the DC-to-DC voltage converter of FIG. 3 shown in more detail.

Referring also to FIG. 4, there illustrated in more detail is a schematic and block diagram of the DC-to-DC voltage converter 124 of the biasing scheme of the present invention. The input signal on the line 160 from the second resistor 152 is fed to a relaxation oscillator 164. The output of the oscillator 164 is a sine wave signal on a line 168, which is fed to the input of a voltage multiplier 172. The output of the voltage multiplier 172 on a line 176 is fed to a resistor 180 having a value of, e.g., 50 megohms. This resistor 180 prevents arcing of the output voltage of the DC-to-DC converter 124. The other side of the resistor 180 represents the output of the DC-to-DC voltage converter 124 on the line 184, which is fed to the conversion dynode 108.

Figure 5:
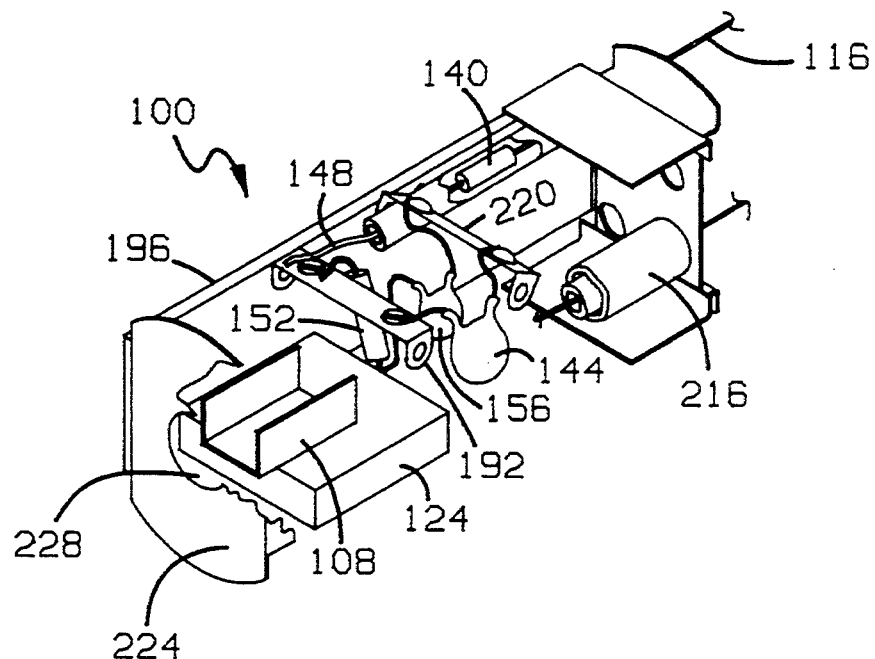
FIG. 5 is a perspective view, partially cutaway, of an electron multiplier having the biasing scheme of FIG. 2.
Figure 6:
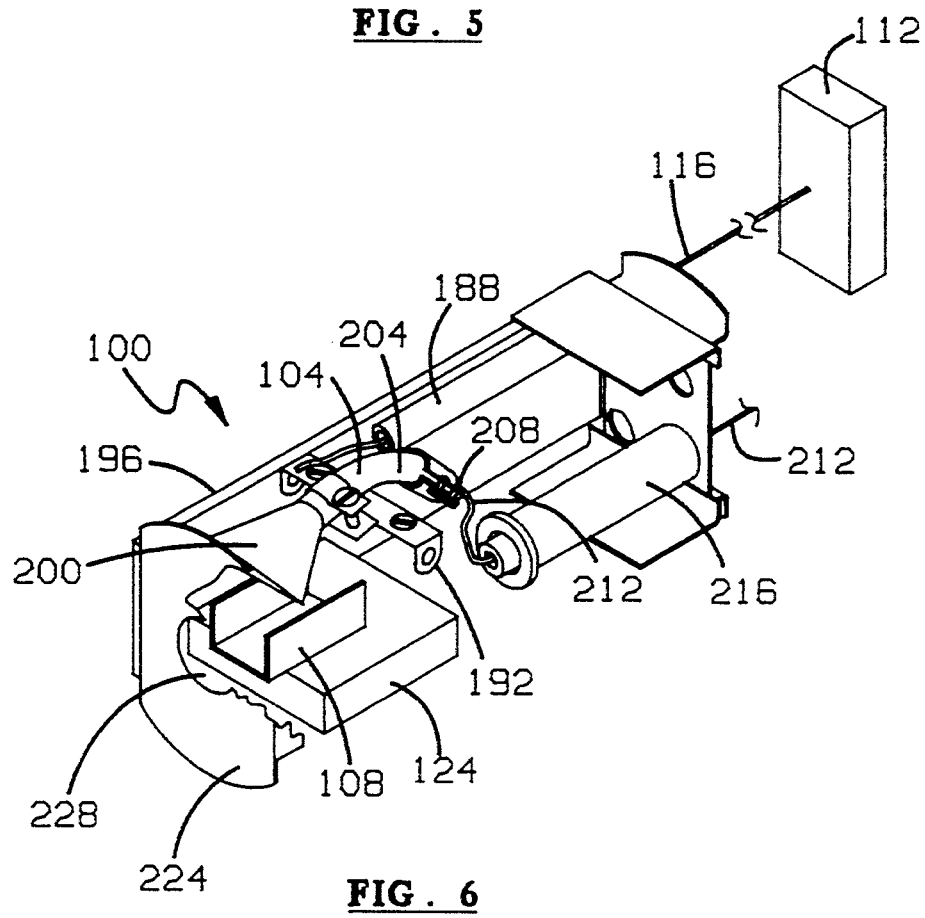
FIG. 6 is another perspective view, partially cutaway, of the electron multiplier package having the biasing scheme of FIG. 2.

Referring now to FIGS. 5 and 6, there illustrated in perspective view, partially cutaway and partially assembled, is the electron multiplier 100 having the biasing scheme of the present invention. For better clarity and understanding of the nature of the structure of the electron multiplier 100, FIGS. 5 and 6, illustrate the electron multiplier 100 with different amounts of structural components. The electron multiplier 100 may be that available from Detector Technology, Inc., of Sturbridge, Mass., the assignee of the present invention. The electron multiplier 100 may be used within scientific instrumentation, such as, without limitation, a mass spectrometer; more specifically, the Model Inficon Auditor II from Leybold Hereaus. When used in such instrumentation, the electron multiplier 100 senses one or more atomic or subatomic particles, such as ions or electrons, and converts the particle into a more easily manipulable electronic signal at the output of the electron multiplier 100, such signal being used by further signal processing circuitry (not shown) within the spectrometer.

Although not shown in FIGS. 5 or 6, typically the electron multiplier 100 is fully enclosed such that its internal components are disposed within vacuum environment having a pressure of, e.g., $5 \times 10^{-6}$ Torr. Operation of an electron multiplier 100 at such reduced pressure is common, since higher pressure operation can result in reduced life of the multiplier 100.

The voltage on the line 116 from the external power supply 112 passes through a feedthrough 120 (i.e., a "hole") in the rear of the electron multiplier 100, and is fed along a line (i.e., wire) 116 that is encased within a ceramic tube 188. Disposed within the tube 188 is the first resistor 140 (FIG. 5) having axial leads, connected at one end to the input wire 116, and connected at its other end to a second wire representative of the line 148. The second wire 148 emanates from the ceramic tube 188 and is spot welded or soldered to a metallic brace 192, one end of which is attached to a ceramic insulated side panel 196 of the multiplier 100 package. One end of the first capacitor 144 is soldered to this brace 192, along with one end of the second resistor 152. The other end of the second resistor 152, along with a first end of the second capacitor 156 are connected directly to the input of the DC-to-DC voltage converter 124. The first brace 192 is in physical contact with, and is soldered to, the outer stainless steel conductive surface of the detector 104.

The detector 104 comprises a two-piece element having a cone-shaped input 200 for gathering or sensing atomic or subatomic particles, while the body 204 of the detector 104 comprises a curved-shaped portion disposed after the cone 200. The body 204 of the detector 104 is curved in a well-known manner to eliminate ion feedback. The output end of the detector has a metal bracket 208 soldered thereto, and a wire 212 is spot welded to this bracket 208. The other end of the wire 212 is routed through a ceramic tube 216 and leaves the electron multiplier 100 through a feedthrough where it can be accessed by other signal processing circuitry (not shown) within the spectrometer.

The other end of both capacitors 144,156, as well as a terminal of the DC-to-DC converter 124 is connected to a second metal brace 220 that is connected to electrical ground. The output of the DC-to-DC voltage converter 124 connects to the conversion dynode 108 typically by fastening the metal conductive dynode 108 to the appropriate point on a circuit board (not shown) of the DC-to-DC voltage converter 124.

The front surface 224 of the electron multiplier 100 package has an aperture 228 formed therethrough, through which the particles to be sensed pass and are sensed by the conversion dynode 108 and cone 200 portion of the detector 104. Not illustrated in FIGS. 5 and 6 is a second ceramic insulated side panel that is similar to the ceramic side panel 196 disposed on the left side of the electron multiplier 100 of FIGS. 5 and 6. Such ceramic insulator on the right-hand side of the electron multiplier 100 is not shown so that the internal components of the multiplier can be easily viewed.

The present invention has described a biasing scheme for an electron multiplier 100 having a detector 104 and conversion dynode 108 in which a DC-to-DC voltage converter 124 has been provided that steps up the voltage from an external detector power supply 112. However, it is to be understood that the broadest scope of the invention is not limited as such. That is, the DC-to-DC voltage converter 124 may instead be utilized to decrease or "step down" the voltage from an external power supply 112. In such configuration, the external power supply 112 would be of a value sufficient to power the conversion dynode 108, which has a higher power requirement than that of the detector 104. The voltage converter 124 would then be used to decrease the voltage to a value suitable for the detector 104.

Also, the DC-to-DC voltage converter 124 has been described as being disposed within a vacuum enclosure of the electron multiplier 100. However, the invention is not limited as such. Instead, the DC-to-DC voltage converter 124 may be disposed outside of the electron multiplier 100. However, in such embodiment, a second feedthrough must be provided to accommodate the second voltage value being applied to the conversion dynode 108. Such embodiment where the DC-to-DC voltage converter 124 is disposed outside of the vacuum portion of the multiplier 100 may be necessary and desirable when no physical space exists for placing the converter 124 therewithin.

It should be understood by those skilled in the art that obvious structural modifications can be made without departing from the spirit of the invention. Accordingly, reference should be made primarily to the accompanying claims, rather than the foregoing specification, to determine the scope of the invention.

Having thus described the invention, what is claimed is:

1. An electron multiplier for sensing one or more atomic or subatomic particles at an input of the multiplier, and for providing a signal at an output of the multiplier indicative of a characteristic of the input particles; the multiplier having a detector for sensing the input particles and for providing the multiplier output signal through a process of electron multiplication by secondary emission of electrons within an interior portion of the detector; the multiplier including a conversion dynode for assisting the detector in the sensing of the input particles; the detector being biased by an applied voltage of a predetermined first value, the conversion dynode being biased by an applied voltage of a predetermined second value that is different in value from the predetermined first value, wherein the improvement comprises:

a DC-to-DC voltage converter, having an input responsive to either the predetermined first voltage value or the predetermined second voltage value, for providing at an output thereof either the predetermined first voltage value or the predetermined second voltage value that the converter is not responsive to at its input.

2. The electron multiplier of claim 1, wherein the electron multiplier is operable in an environment having a vacuum pressure of a predetermined value.

3. The electron multiplier of claim 2, wherein the DC-to-DC voltage converter is disposed within the vacuum environment.

4. The electron multiplier of claim 2, wherein the DC-to-DC voltage converter is disposed outside of the vacuum environment.

5. The electron multiplier of claim 1, wherein the detector and the DC-to-DC voltage converter are responsive to the predetermined first voltage value, the DC-to-DC voltage converter being operable to provide the predetermined second voltage value to the conversion dynode.

6. The electron multiplier of claim 5, wherein the predetermined second voltage value is greater in magnitude than the predetermined first voltage value.

7. The electron multiplier of claim 1, further comprising filter means disposed at an input of the detector, for filtering any transients in the voltage applied to the detector.

8. The electron multiplier of claim 1, further comprising filter means disposed at an input of the conversion dynode, for filtering any transients in the voltage applied to the conversion dynode.

9. The electron multiplier of claim 1, wherein the DC-to-DC voltage converter comprises:
   a. a relaxation oscillator, responsive to the voltage applied to the detector, for providing a sine wave signal at an output of the oscillator; and
   b. a voltage multiplier, responsive to the sine wave signal at the output of the oscillator, for providing the bias voltage to the conversion dynode.

10. An electron multiplier, comprising:
   a. a detector for sensing atomic or subatomic particles applied to an input of the detector, and for providing an output signal indicative of a characteristic of the particles, the detector having a bias voltage of a predetermined value applied to an input thereof;
   b. a conversion dynode for assisting the detector in the sensing of the atomic or subatomic particles, the conversion dynode having a bias voltage of a predetermined value applied to an input thereof, the conversion dynode bias voltage being different in value than the detector bias voltage; and
   c. DC-to-DC voltage converter means, responsive to the detector bias voltage, for converting the detector bias voltage to a value that equals the conversion dynode bias voltage, and for applying the conversion dynode bias voltage to the input of the conversion dynode.

11. The electron multiplier of claim 10, wherein the electron multiplier is operable in an environment having a vacuum pressure of a predetermined value.

12. The electron multiplier of claim 10, wherein the detector and the conversion dynode are operable within an environment having a vacuum pressure of a predetermined value.

13. The electron multiplier of claim 12, wherein the DC-to-DC voltage converter means is disposed outside of the vacuum environment.

14. The electron multiplier of claim 10, wherein the conversion dynode bias voltage is greater in value than the detector bias voltage.

15. The electron multiplier of claim 10, further comprising filter means disposed at an input of the detector, for filtering any transients in the voltage applied to the detector.

16. The electron multiplier of claim 10, further comprising filter means disposed at an input of the conversion dynode, for filtering any transients in the voltage applied to the conversion dynode.

17. The electron multiplier of claim 10, wherein the DC-to-DC voltage converter means comprises:
   a. a relaxation oscillator, responsive to the voltage applied to the detector, for providing a sine wave signal at an output of the oscillator; and
   b. a voltage multiplier, responsive to the sine wave signal at the output of the relaxation oscillator, for providing the bias voltage to the conversion dynode.

* * * * *